FREQUENCY CONTROL CIRCUIT FOR TELEVISION HORIZONTAL OSCILLATOR

Filed Oct. 11, 1966

INVENTORS
JOSEPH L. MENENDEZ,
BENTON B. SCOTT
BY
Robert E. Strausser
ATTORNEY

United States Patent Office
3,439,116
Patented Apr. 15, 1969

3,439,116
FREQUENCY CONTROL CIRCUIT FOR TELEVISION HORIZONTAL OSCILLATOR

Joseph Lee Menendez and Benton Boyd Scott, Batavia, N.Y., assignors to Sylvania Electric Products Inc., a corporation of Delaware
Filed Oct. 11, 1966, Ser. No. 585,969
Int. Cl. H04n *3/16, 5/44;* H04l *7/04*
U.S. Cl. 178—7.3 9 Claims This invention relates to balanced bias control circuitry and more particularly to balanced bias "hold" control circuitry in a television receiver utilizing a balanced phase detector and an oscillator which loads down the bias circuitry.

Figures 1, 2:
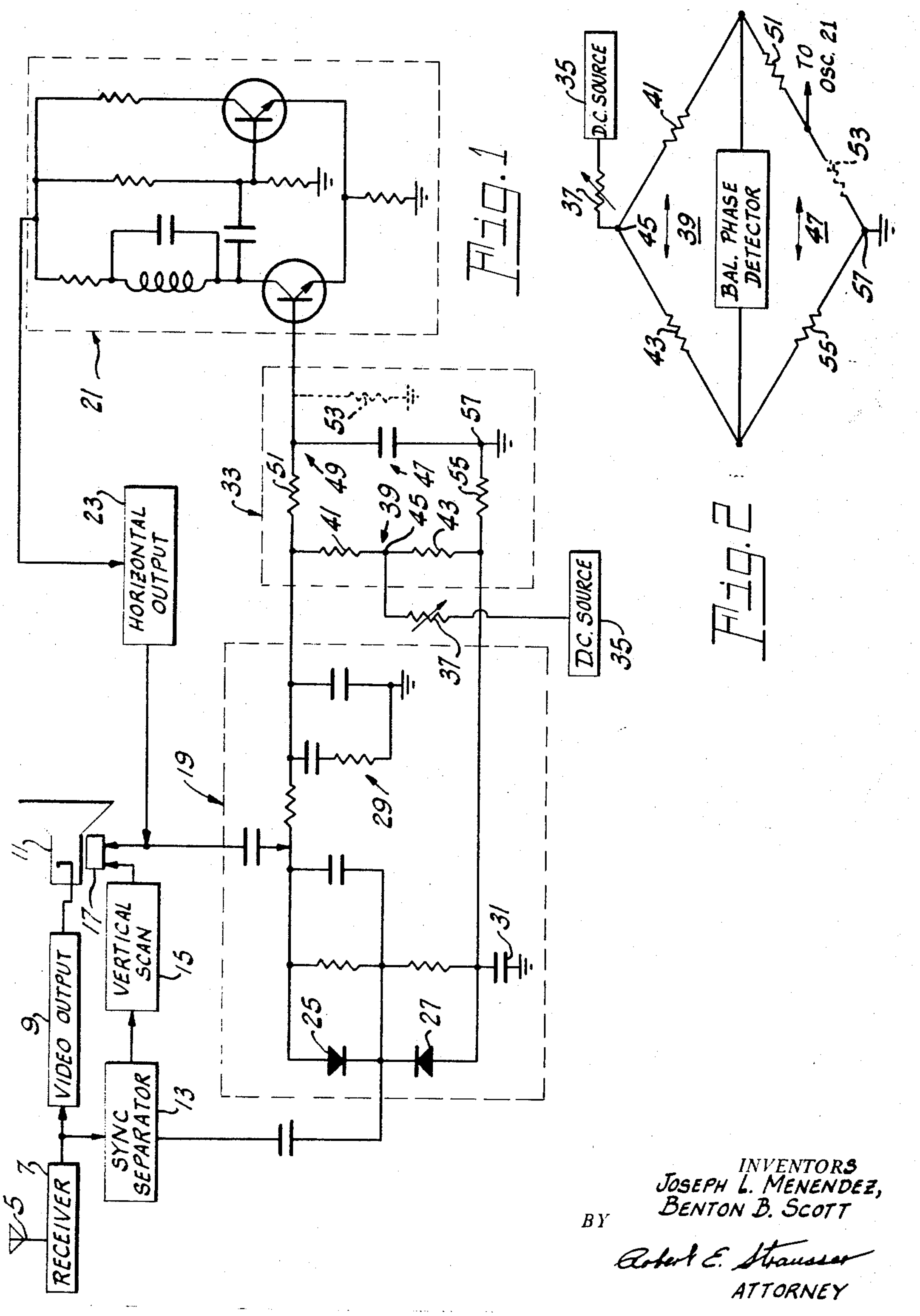

Electrical apparatus includes many instances wherein a signal at fundamental frequency and a signal generated by a local oscillator are compared and the frequency of the local generated oscillator signal shifted to synchronize with the signal of fundamental frequency. Such circuitry normally includes a phase detector responsive to the phase differential between the applied signals to provide a control signal which is applied to the local oscillator to cause the above shift in the frequency of the generated signal. Further, means are usually provided for altering the fundamental frequency of the oscillator.

More specifically, one well-known form of such electrical apparatus is a television receiver wherein horizontal synchronizing pulses in a transmitted signal are compared by a phase detector with a pulse signal generated by a local oscillator. The phase detector provides a control signal in accordance with the phase differential between the two signals and this control signal is, in turn, applied to the local oscillator in a manner such that the signal available from the oscillator tends to approach the phase of the synchronizing pulses in the transmitted signal. Also, adjustable means, normally referred to as a "hold" control, are usually provided for establishing the correct basic oscillator frequency.

One known technique for accomplishing the above-mentioned desirable results is to utilize a balanced phase detector for developing the control voltage which is applied to the control electrodes of an oscillator employing electron discharge devices or electron tubes. Also, a voltage is applied to the cathodes of the discharge devices to provide a negative polarity bias for the discharge devices and establish the correct basic oscillator frequency. Moreover, application of the bias developing potentials to the cathodes of the discharge devices in no way disturbs the balance of the phase detector or the effectiveness of the control signal available therefrom.

However, it has been found that such desirable conditions do not obtain when the oscillator is of the type which employs a control element requiring current flow which tends to load down the balanced phase detector. In such circuitry, the oscillator requires a DC bias potential which may be of positive or negative polarity depending upon the specific type of semiconductor utilized. More importantly, this DC bias potential must be applied in a manner such that the balance of the phase detector is substantially unaffected by bias potential alterations.

Therefore, it is an object of this invention to provide an enhanced phase and frequency control circuit for an oscillator operating in conjunction with and loading down a balanced bias control circuit.

Another object of the invention is to enhance the operation of a television receiver employing an oscillator having a control element which requires current flow and a balanced phase detector and responsive to synchronizing pulses in a transmitted signal.

Still another object of the invention is to provide improved balanced bias hold control circuitry for a television receiver utilizing a balanced phase detector and transistorized oscillator.

These and other objects are achieved in one aspect of the invention by a four-armed balanced bridge network having an oscillator requiring current flow in a control element connected into one arm thereof, a balanced phase detector connected in shunt across the "null" point of the bridge network, and an adjustable impedance coupling a DC potential source to the balanced bridge network whereby the balance of the phase detector is substantially unaffected by alterations of the adjustable impedance.

For a better understanding of the present invention, together with other and further objects, advantages, and capabilities thereof, reference is made to the following disclosure and appended claims in connection with the accompanying drawing in which:

FIG. 1 is a block and schematic diagram illustrating a a television receiver employing one embodiment of the invention; and FIG. 2 is a simplified explanatory equivalent diagram of a portion of the embodiment of FIG. 1.

Referring to the drawing, FIG. 1 illustrates a television receiver having an antenna 5 for intercepting transmitted television signals which include synchronizing pulse signals at a fundamental frequency of about 15,750 cycles. This signal is coupled to a receiver 7 which includes the well-known RF, IF, and video signal amplifying and detecting stages and provides a detected video signal. This video signal is applied to a video output stage 9 and then to a visual display device in the form of a cathode ray tube 11 to cause development of a luminance representation of a scene viewed by a television camera.

Another detected video signal output from the receiver 7 is applied to a sync pulse separating stage 13 wherein synchronizing pulses at the vertical and the horizontal frequency are separated from the video signal. The vertical synchronizing pulses are applied to vertical scanning circuitry 15 wherein potentials of suitable form, magnitude, and frequency are developed and applied to deflection apparatus 17 associated with the cathode ray tube 11. These potentials and the deflection apparatus 17 serve to cause an electron beam of the cathode ray tube 11 to vertically scan the viewing screen of the cathode ray tube 11 at a rate corresponding to the vertical scanning rate of a television camera at a signal transmitting station. Also, the horizontal synchronizing pulses are coupled to a balanced phase detector 19 which will be more fully explained hereinafter.

A transistorized local oscillator 21 generates a signal which is applied to a horizontal output stage 23 wherein are developed potentials of suitable magnitude and shape which, in turn, are applied to the deflection apparatus 17. The deflection apparatus 17 is associated with the cathode ray tube 11 and the above-mentioned applied potentials cause the electron beam of the cathode ray tube 11 to horizontally scan the viewing screen at a rate which corresponds to the horizontal scanning rate of a television camera.

As mentioned above, the horizontal synchronizing pulses from the sync pulse separating stage 13 are applied to a balanced phase detector stage 19. This balanced phase detector stage is of a type well-known in the art and includes a pair of rectifiers 25 and 27 connected in current conducting opposition and an RC filter network 29 having an appropriate time constant. Also, the balanced detector stage 19 includes a capacitor 31 coupled intermediate thereto and circuit ground to provide DC isolation therebetween as will be explained hereinafter.

Also, a portion of the signal generated by the local oscillator 21 is applied, via the horizontal output stage 23, to the balanced phase detector 19. Therein, the phase relationship of the horizontal synchronizing pulses and the signal generated by the local oscillator 21 is compared and the phase differential therebetween causes development of a DC "error" or control signal.

This "error" or control signal is DC coupled to the transistorized local oscillator 21 by way of a four-armed balanced bridge network 33. The "error" or control signal, coupled to the local oscillator 21 via the balanced bridge network 33, serves to alter the operation of the local oscillator in a manner such that the phase differential between the synchronizing pulses and the oscillator signals applied to the balanced phase detector 19 tends to be minimized. In other words, the transistorized local oscillator signal becomes synchronized with or at least approaches synchronization with the horizontal synchronizing pulses contained in the signal received from a television transmitter. Moreover, this substantially synchronized signal from the local oscillator 21 is applied to and controls the horizontal scanning apparatus 17 associated with the color cathode ray tube 11.

Additionally, the four-armed balanced bridge network 33 permits the application of positive polarity bias potentials to the transistorized local oscillator 21 without causing an unbalance of or a deleterious effect upon the balanced phase detector 19. Specifically, a DC potential available from a DC potential source 35 is applied, via an alterable impedance 37, to the four-armed balanced bridge network 33 and, subsequently, to the transistorized local oscillator 21. This applied DC potential which serves to establish the basic frequency of the transistorized local oscillator 21 is controlled by the alterable impedance 37 which is commonly referred to as the "horizontal hold control." Moreover, the previously mentioned capacitor 31 provides an AC path to circuit ground for the balanced phase detector 19 while isolating the balanced phase detector 19 and circuit ground in so far as DC potentials are concerned. Thus, the DC balance of the phase detector is substantially unaffected by the potential applied from the DC source 35.

Referring to the four-armed balanced bridge circuit 33, a first pair of adjacent arms 39 includes a first arm containing an impedance 41 series connected to a second arm containing an impedance 43 at a junction 45. The first pair of adjacent arms 39 is connected in shunt with the balanced phase detector 19 and each of the impedances 41 and 43, respectively, have a substantially equal value of resistance.

A second pair of adjacent arms 47 includes a first arm containing an impedance 49 which is a combination of the series connected resistor 51 and the base to ground resistance 53 (dotted lines) of the input circuit of the transistorized local oscillator 21. A second arm contains an impedance 55 and is connected in series with the first arm at a junction 57. The impedance of each of the arms is of substantially equal resistive value and the second pair of adjacent arms 47 is connected in shunt with the balanced phase detector 19 with the junction 57 thereof connected to circuit ground. Thus, the first pair of adjacent arms 39, the second pair of adjacent arms 47, and the balanced phase detector 19 are all shunt connected.

In the interest of clarity and explanation, reference is made to the illustration of FIG. 2 wherein the same numbers have been used to designate components as was used in FIG. 1. As can be seen, the first pair of adjacent arms 39 and the second pair of adjacent arms 47 are connected in shunt with the balanced phase detector network 19. Also, the junction 57 of the second pair of adjacent arms 47 is connected to circuit ground while the junction 45 of the first pair of adjacent arms 39 is connected to the adjustable impedance 37 or "horizontal hold control" which is coupled to the DC potential source 35. Thus, the balanced phase detector 19 may be said to be connected intermediate the "null" points of the four-armed balanced bridge network 33.

In operation, it can be readily understood that a variation in the setting of the alterable impedance 37 will cause a change in the positive polarity DC potential applied to the transistorized local oscillator 21. Also, this variation in positive polarity DC potential applied to the local oscillator 21 has substantially no effect upon the balanced phase detector 19 due to the fact that the phase detector 19 is connected intermediate the "null" points of the four-armed balanced bridge network 33.

Further, it can be readily understood that a control or "error" signal developed by the balanced phase detector 19 will be applied to the transistorized local oscillator 21 to shift the operational frequency thereof and tend to correct any phase differential between the signals applied to the balanced phase detector 19.

Thus, means have been provided for applying an adjustable DC bias potential to a local oscillator of the type having a control element requiring current flow to cause variations in the basic oscillation frequency thereof. Also, means have been provided for applying a control or "error" signal to the local oscillator to cause a shift in the phase thereof which tends to synchronize the signal therefrom with a received signal. Moreover, the circuitry permits the application of both signals without undesired and deleterious effects upon each other or the apparatus associated therewith.

Merely by way of illustration, and not in any sense by way of limitations, the following are representative component values which provide satisfactory operation of the circuitry illustrated in FIG. 1.

| Resistors: | Ohms |
|---|---|
| 37 (adj.) | 10,000 |
| 41 | 22,000 |
| 43 | 22,000 |
| 55 | 33,000 |
| 51 | 10,000 |
| Base to ground impedance 53 | 22,000 |

Thus, there has been provided unique and enhanced circuitry for controlling the frequency of a local oscillator having a control element requiring current flow and operating in conjunction with a balanced phase detector. The circuitry provides for the application of required DC biasing potentials to the oscillator without deleterious effect upon the balanced phase detector. Further, the control circuitry is inexpensive in both assembly and componentry and has a minimum of complexity. Moreover, the circuitry provides an improved horizontal "hold" control suitable for television circuitry.

While there has been shown and described what is at present considered the preferred embodiment of the invention, it will be obvious to those skilled in the art that various changes and modifications may be made therein without departing from the invention as defined by the appended claims.

What is claimed is:

1. In electronic apparatus which includes a source of signals at a fundamental frequency, a local oscillator having a control element requiring current flow and capable of being synchronized to provide signals at said fundamental frequency, a balanced phase detector responsive to the phase differential of said fundamental frequency signals and said oscillator signals to provide a control signal, and means for applying signals from said source and said oscillator to said balanced phase detector, a balanced bias control circuit comprising in combination:

a DC potential source;

a four-armed balanced bridge network including first and second series connected arms and third and fourth series connected arms connected in shunt with said balanced phase detector, said first and second arms each containing an impedance of substantially equal value and said third and fourth arms each containing an impedance of substantially equal value, said third and fourth series connected arms having the junction thereof connected to circuit ground with the impedance in one of said arms including said local oscillator; and an adjustable impedance connecting said DC potential source to the junction of said first and second series connected arms whereby said oscillator is responsive to variations in said control signals from said balanced phase detector and said potential from said DC source and the balance of said phase detector is substantially unaffected by said DC potential variations.

2. The balanced bias control circuit of claim 1 including means AC coupling and DC isolating said balanced phase detector and circuit ground.

3. The balanced bias control circuit of claim 1 wherein said local oscillator employs semiconductors and said impedance in one of said arms includes a series connected resistor and the base to circuit ground impedance of said local oscillator.

4. The balanced bias control circuit of claim 1 wherein said adjustable impedance is in the form of an alterable resistor.

5. The balanced bias control circuit of claim 1 wherein the impedance contained in each of said first, second, and third arms is in the form of a resistor and the impedance of the fourth arm includes a series connected resistor and the input impedance of said local oscillator.

6. The balanced bias control circuit of claim 3 including a filter network coupled intermediate said arm and circuit ground.

7. In a television receiver, a balanced bias hold control circuit comprising in combination:

a source of signals at a fundamental frequency;

a transistorized oscillator capable of providing signals at said fundamental frequency;

a balanced phase detector coupled to said signal source and to said oscillator, said detector providing a control signal which varies in accordance with the phase differential between the signals applied from said source and said oscillator;

a four-armed balanced bridge network including first and second series connected arms each having an impedance of substantially equal value connected therein and third and fourth series connected arms each having an impedance of substantially equal value connected therein with the impedance in one of said third and fourth arms including the input impedance of said transistorized oscillator;

a DC potential supply;

an adjustable impedance connected to said supply; and means for connecting said first and second series connected arms and said third and fourth series connected arms in shunt with said balanced phase detector and the junction of said first and second arms to said adjustable impedance and the junction of said third and fourth arms to circuit ground.

8. The balanced bias hold control circuit of claim 7 wherein a DC isolating means couples said balanced phase detector to circuit ground and said adjustable impedance is in the form of an alterable resistor.

9. The balanced bias hold control circuit of claim 7 wherein the impedance in one of said third and fourth arms of said balanced bridge network includes a resistor in series connection with the base to ground impedance of the input transistor of said oscillator.

References Cited

UNITED STATES PATENTS 2,730,622 1/1956 Janssen -------- 178—69.5 XR

ROBERT L. GRIFFIN, *Primary Examiner.*

ROBERT L. RICHARDSON, *Assistant Examiner.*

U.S. Cl. X.R.

178—69.5; 307—295; 331—20, 34, 108